United States Patent
Lee et al.

(10) Patent No.: US 9,455,144 B2
(45) Date of Patent: Sep. 27, 2016

(54) METHOD FOR GROWING NITRIDE-BASED SEMICONDUCTOR WITH HIGH QUALITY

(71) Applicant: GWANGJU INSTITUTE OF SCIENCE AND TECHNOLOGY, Gwangju (KR)

(72) Inventors: Dong-Seon Lee, Gwangju (KR); Dong-Ju Seo, Gwangju (KR); Jun-Youb Lee, Gwangju (KR); Chang-Mo Kang, Gwangju (KR); Won-Seok Seong, Gwangju (KR); Mun-Do Park, Gwangju (KR)

(73) Assignee: GWANGJU INSTITUTE OF SCIENCE AND TECHNOLOGY, Gwangju (KR)

(*) Notice: Subject to any disclaimer, the term of this patent is extended or adjusted under 35 U.S.C. 154(b) by 0 days.

(21) Appl. No.: 14/859,898

(22) Filed: Sep. 21, 2015

(65) Prior Publication Data
US 2016/0093492 A1    Mar. 31, 2016

(30) Foreign Application Priority Data
Sep. 26, 2014    (KR) ........................ 10-2014-0128804

(51) Int. Cl.
| H01L 21/02  | (2006.01) |
| H01L 21/033 | (2006.01) |
| H01L 21/311 | (2006.01) |

(52) U.S. Cl.
CPC ..... *H01L 21/02639* (2013.01); *H01L 21/0254* (2013.01); *H01L 21/02642* (2013.01); *H01L 21/02647* (2013.01); *H01L 21/0332* (2013.01); *H01L 21/0337* (2013.01); *H01L 21/31111* (2013.01); *H01L 21/31116* (2013.01)

(58) Field of Classification Search
None
See application file for complete search history.

(56) References Cited

U.S. PATENT DOCUMENTS

| 6,633,056 | B2* | 10/2003 | Xie ...................... H01L 21/0237 257/103 |
| 6,759,139 | B2* | 7/2004 | Kunisato ............... H01L 33/007 257/103 |
| 7,279,344 | B2* | 10/2007 | Hayashi ................. B82Y 20/00 257/103 |
| 8,878,243 | B2* | 11/2014 | Lochtefeld ........ H01L 21/02647 257/14 |
| 9,190,566 | B2* | 11/2015 | Choi ....................... H01L 33/12 |
| 2002/0038870 | A1* | 4/2002 | Kunisato ............. H01L 33/0075 257/85 |
| 2006/0292719 | A1* | 12/2006 | Lochtefeld ........ H01L 21/02381 438/22 |
| 2015/0050762 | A1* | 2/2015 | Lee ..................... H01L 33/0079 438/29 |
| 2015/0137072 | A1* | 5/2015 | Lee ....................... C30B 29/403 257/14 |

FOREIGN PATENT DOCUMENTS

KR    1020050000511 A    1/2005

* cited by examiner

*Primary Examiner* — Andres Munoz
(74) *Attorney, Agent, or Firm* — Hauptman Ham, LLP

(57) ABSTRACT

Disclosed is a method for growing a nitride-based semiconductor with high quality, the method including: forming a first mask layer on a substrate and forming a second mask layer on the first mask layer; performing dry etching on the first mask layer and the second mask layer to form an opening in which a part of the substrate is exposed; performing selective wet etching on the first mask layer in the opening to form a recess in which a part of the substrate is exposed; depositing a third mask layer in the recess; and growing a nitride-based semiconductor from the exposed part of the substrate on sides of the third mask layer and expanding the growth via the opening.

11 Claims, 15 Drawing Sheets

Dislocation Free GaN Lift – off

Lateral Epitaxial Over Growth Tech.

METHOD FOR GROWING NITRIDE-BASED SEMICONDUCTOR WITH HIGH QUALITY

CROSS-REFERENCE TO RELATED APPLICATIONS

This application claims the benefit of Korean Patent Application No. 10-2014-0128804, filed on Sep. 26, 2014, entitled "METHOD FOR GROWING NITRIDE-BASED SEMICONDUCTOR WITH HIGH QUALITY", which is hereby incorporated by reference in its entirety into this application.

TECHNICAL FIELD

The present disclosure relates to a method for growing a nitride-based semiconductor with high quality. More specifically, the present disclosure relates to a method for growing a nitride-based semiconductor with high quality, by which threading dislocation defects are drastically reduced.

BACKGROUND ART

In manufacturing an electronic device by using the technology of growing a GaN film on a substrate such as sapphire, lattice mismatch due to the different lattice constants appears seriously at the interface between the substrate and the GaN film (see FIG. 5a). Dislocations due to such lattice mismatch are transferred into the GaN thin film, so that the performance of an electronic device such as an LED and a solar cell is significantly degraded. To improve the performance and reliability of an LED, it has been proposed to grow a GaN thin film having a lower defect density on a sapphire substrate.

To that end, the epitaxial lateral overgrowth (ELOG) technique has been developed in which a mask made of $SiN_x$ or $SiO_2$ material is patterned on a sapphire substrate or a GaN thin film grown on the sapphire substrate, and then the GaN thin film is grown (see FIG. 5c).

According to the ELOG technique, the $SiO_2$ mask blocks the transfer of defects in the GaN thin film caused between different materials, so that the threading dislocation defects has been drastically reduced to approximately $10^7$ cm$^{-2}$. However, there is a problem in that the process of growing crystal is divided into two steps, which increases chances of processing failure caused by contamination, etc.

To remedy such shortcoming of the ELOG technique, the patterned sapphire substrate (PSS) that has micrometer-size structures thereon have been widely used (see FIG. 5b). The PSS typically has periodic structures having a shape such as polygons or cones having a size of several μm, which are arranged in the four directions spaced apart from one another by a distance of several μm and may protrude or be depressed from the surface. The depth or height of the pattern is typically more or less 0.5 μm, and the pattern is formed by dry or wet etching.

The method for growing a GaN single crystal using the PSS can improve the light extraction efficiency by approximately 15% when applied to an LED, compared to a method using a typical flat sapphire substrate, since light is reflected in the interface of the substrate having depressions. However, it fails to improve the basic cause of the defect density. This is not because the defects in the GaN are reduced but because light is concentrated due to the reflection in the interface of the substrate. Accordingly, there is still a problem in the reliability of the optical device.

Further, according to the ELOG technique and the PSS, since $SiO_2$ is deposited via a photolithography process and micro-patterned by dry or wet etching, the process becomes complicated and thus there are more chances of failure. In addition, the ELOG technique and the PSS cannot significantly reduce the threading dislocations generated in the vertical direction, which affect the performance of the device most.

RELATED ART DOCUMENT

Patent Document (Patent Document 1) Korean Patent Laid-Open Publication No. 2005-0000511

DISCLOSURE

Technical Problem

An aspect of the present disclosure is to provide a method for growing a nitride-based semiconductor, by which threading dislocations due to lattice mismatch at the interface between a substrate and a nitride-based semiconductor can be drastically reduced, and the process of growing crystal becomes simpler so that process failure can be reduce.

It should be noted that objects of the present disclosure are not limited to the above-mentioned object; and other objects of the present disclosure will be apparent to those skilled in the art from the following descriptions.

Technical Solution

According to an aspect of the present disclosure, a method for growing a nitride-based semiconductor with high quality includes: forming a first mask layer on a substrate and forming a second mask layer on the first mask layer; performing dry etching on the first mask layer and the second mask layer to form an opening in which a part of the substrate is exposed; performing selective wet etching on the first mask layer in the opening to form a recess in which a part of the substrate is exposed; depositing a third mask layer in the recess; and growing a nitride-based semiconductor from the exposed part of the substrate on sides of the third mask layer and expanding the growth via the opening.

Advantageous Effects

According to an exemplary embodiment of the present disclosure, threading dislocations due to lattice mismatch at the interface between a substrate and a nitride-based semiconductor can be drastically reduced, the process failure can be reduced, and defects in the thin film can be minimized, thereby improving reliability.

DESCRIPTION OF DRAWINGS

The above and other aspects, features and advantages of the present invention will become apparent from the following description of exemplary embodiments given in conjunction with the accompanying drawings, in which.

BEST MODE

Figure 1A:
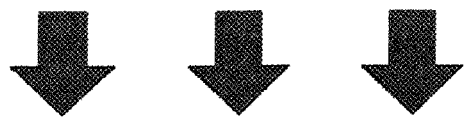
FIGS. 1a to 1f are schematic views for illustrating a method for growing a nitride-based semiconductor with high quality, according to an exemplary embodiment of the present disclosure.
Figure 1A:
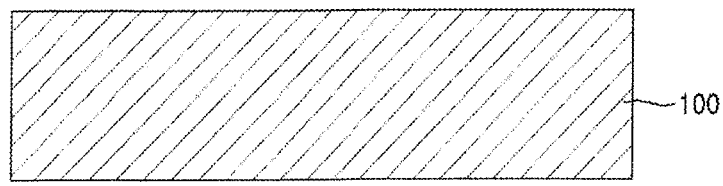
Figure 1B:
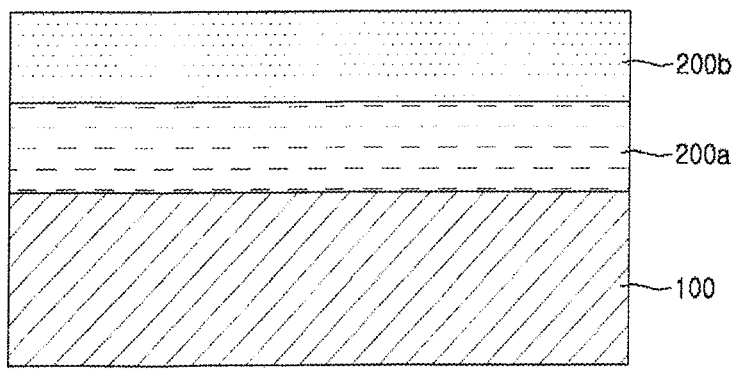
Figure 1C:
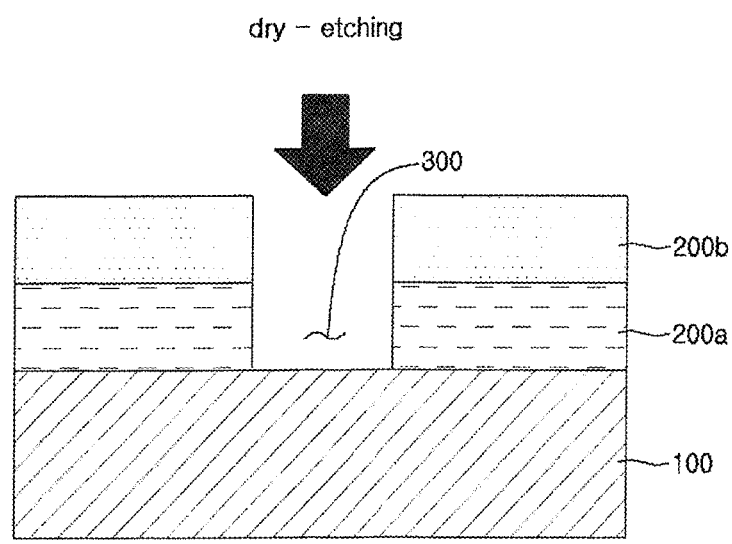
Figure 1D:
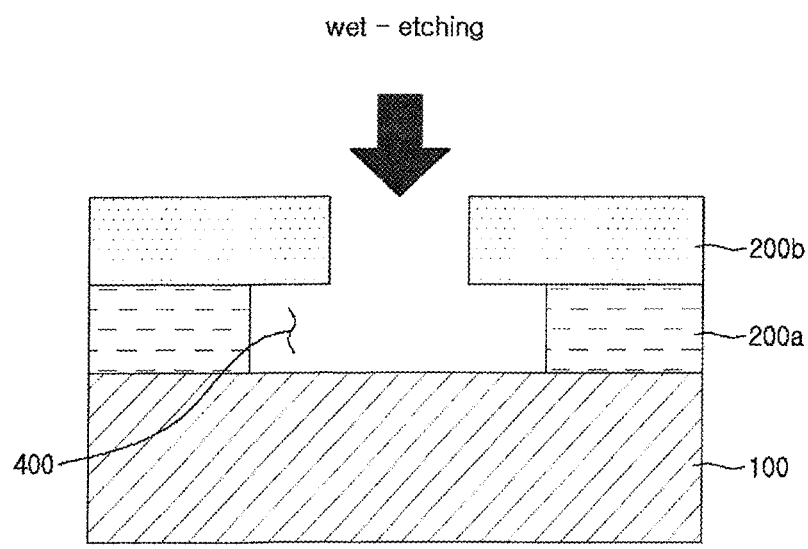
Figure 1E:
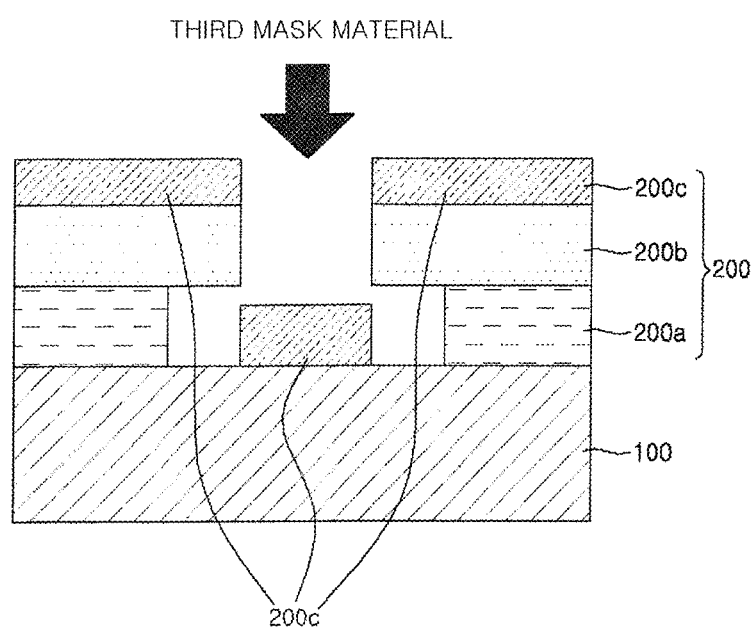

Hereinafter, exemplary embodiments of the present disclosure will be described in detail with reference to the accompanying drawings so as to enable those skilled in the art to easily practice the exemplary embodiments. However, exemplary embodiments of the present disclosure may be modified in various different ways and are not limited to those illustrated herein. In the accompanying drawings, non-essential elements are omitted in order not to unnecessarily obscure the gist of the present disclosure. Further, like reference numerals are used to denote like elements throughout the specification.

As used herein, a phrase "an element A on an element B" refers to that the element A may be disposed directly on the element B and/or the element A may be disposed indirectly on the element B via another element C.

Throughout the detailed descriptions, the terms "comprising" and "including" should not be interpreted as being restricted to the means listed thereafter; it does not exclude other elements or steps, unless explicitly stated otherwise. In the following descriptions, the terms "substantially," "about," and "approximately" are used herein to represent the inherent degree of uncertainty by which a quantitative representation may vary from a stated reference without resulting in a change in the basic function of the subject matter at issue. Such terms are described in order to prevent that malicious parties take advantage of specific numerical values given for the purpose of better understanding to limit the scope of the present disclosure. As used herein, the expression "step of" does not mean "step for."

As used herein, the term "a combination thereof" expressed in the Markush group format refers to at least one mixture or combination selected from the group consisting of elements expressed in the Markush group format, i.e., one or more selected from the group consisting of the elements.

As used herein, the terms "comprising," "consisting of," etc., should not be construed as necessarily including all of the elements or steps listed thereafter, but some of the elements or steps may be omitted or additional elements other than the listed elements may further included.

Furthermore, the terms first, second and the like in the description and in the claims are used for distinguishing between similar elements and not necessarily for describing a sequential or chronological order. The terms are used only for distinguishing one component from another component. For example, the terms so used are interchangeable under appropriate circumstances without departing from the scope of the present disclosure.

The present disclosure relates to a technique to reduce dislocations due to lattice mismatch by way of using a T-shaped mask or a metal mask formed by etching in growing a nitride-based semiconductor such as GaN or InGaN on a sapphire or Si substrate. Furthermore, the present disclosure also discloses growing a nitride-based semiconductor layer on a substrate and separating the substrate from the nitride-based semiconductor layer.

The substrate is not particularly limited as long as a nitride-based semiconductor layer can be grown on it, and may be an insulative substrate, a conductive substrate or a circuit board. For example, the material for the substrate may be selected from the group consisting of sapphire, Si, glass, quartz, GaN, GaAs, SiC, ZnO and MgO. In addition, the substrate may be a metal substrate, a ceramic substrate or a PCB.

As used herein, a nitride-based semiconductor may be expressed in the general formula $Al_xGa_yIn_{1-x-y}N$ ($0 \leq x \leq 1$, $0 \leq y \leq 1$, $0 \leq x+y \leq 1$), which embraces binary compounds such as AlN, GaN, InN, ternary compounds such as $Al_xGa_{1-x}N$, $Al_xIn_{1-x}N$, $Ga_xIn_{1-x}N$ (all $0<x<1$), and quaternary compounds such as $Al_xGa_yIn_{1-x-y}N$ ($0<x<1$, $0<y<1$, $0<x+y<1$). As used herein, a nitride-based semiconductor also includes a doped nitride-based semiconductor in which dopants are added to make it p-type or n-type, unless specifically stated otherwise.

Hereinafter, a method for growing nitride-based semiconductor with high quality according to an exemplary embodiment of the present disclosure will be described with reference to FIGS. 1a to 1f and FIGS. 2a to 2d.

Initially, a first mask layer 200a is formed on a substrate 100. Then, a second mask layer 200b is formed on the first mask layer 200a. The first and second mask layers 200a and 200b act as etching masks. To produce a T-shaped mask to be described below, it is desirable that the etching rate of the first mask 200a is larger than the etching rate of the second mask layer 200b.

The first and second mask layers 200a and 200b are preferably made of a dielectric material or a metal material. Each of the first and second mask layers 200a and 200b may contain polycrystalline semiconductor such as polycrystalline silicon and polycrystalline nitride semiconductor, oxide such as silicon oxide ($SiO_x$), silicon nitride ($SiN_x$), titanium oxide ($TiO_x$), zirconium oxide ($ZrO_x$), nitride, and metal having a high melting point such as titan (Ti) and tungsten (W). Specifically, examples of the material for the mask layers may include, but is not limited to, one of $SiO_2$, SiN, $Si_3N_4$, ZnS, $Ta_2O_5$, $TiO_2$, $ZrO_2$, $Y_2O_3$, STO ($SrTiO_3$), BST (($Ba,Sr)TiO_3$), PZT ($PbZr_xTi_yO_z$) and silicon oxynitride (SiON).

The first and second mask layers 200a and 200b may be formed by using techniques such as metal organic chemical vapor deposition (MOCVD), close space vapour phase transport (CSVT), plasma enhanced chemical vapor deposition (PECVD), molecular beam epitaxy (MBE), E-beam evaporation and hydride vapor phase epitaxy (HVPE).

Subsequently, dry etching is performed on the first and second mask layers 200a and 200b, forming an opening 300 via which a part of the substrate 100 is exposed. Anisotropic etching may occur by the dry etching performed with an etching gas.

Examples of the dry etching process includes plasma etching, ion beam milling, reactive ion etching (RIE), magnetically enhanced RIE (MERIE), inductively coupled plasma (ICP), transformer coupled plasma (TCP), electron cyclotron resonance (ECR), etc. The etching gas may be, but is not limited to, at least one gas selected from the group consisting of $Cl_2$, HBr, HCl, $SF_6$, $CF_4$, $CHF_3$, $NF_3$, $O_2$ and chlorofluorocarbons (CFC). In addition, the dry etching may further include using at least one of $N_2$, Ar and He inert gases. The size of the opening 300 may be adjusted by varying the processing time of the dry etching. The opening 300 may be, for example, a stripe or point opening which may be selected from polygons, especially from a hexagon, a triangle and a tetragon, or a combination of such openings.

Forming a pattern on the second mask layer 200b may be performed before the dry etching. The liftoff technique may be used to form a variety of patterns. For example, the second mask layer 200b may have shapes such as a stripe pattern and a polygonal pattern. By using the second mask layer 200b as the etching mask, the first mask layer 200a is etched. As a result, an opening reaching from the second mask layer 200b to the surface of the substrate 100 is formed. In the opening 300, the upper surface of the substrate 100 is exposed.

In the opening 300 formed by the dry etching, the first mask layer 200a is selectively etched by wet etching, forming a recess 400 via which a part of the substrate 100 is exposed. Isotropic etching may occur by the wet etching process. The first mask layer 200a is selectively etched since the etching rate of the first masks layer 200a is larger than the etching rate of the second mask layer 200b.

As an etchant for the wet etching, any etchant may be used as long as it can etch a mask layer containing a dielectric material or a metal material. Examples of the etchant may include one of hydrofluoric acid (HF), hydrochloric acid (HCl), nitric acid ($HNO_3$), sulfuric acid ($H_2SO_4$), phosphoric acid ($H_3PO_4$), oxalic acid, buffered oxide etchant (BOE), sodium hydroxide (NaOH), potassium hydroxide (KOH), hydrogen peroxide ($H_2O_2$), acetone, tetramethyl armmonium hydroxide (TMAH), ethylenediamine, pyrocatechol, hydrazine chelating amines, 1,2-diaminoethane, N,N-dimethylacetamide and water, or a solution prepared as a combination thereof. In addition to the wet etching, the electro-chemical etching (ECE) is not excluded. The wet etching process may be performed at a temperature between a room temperature and 350° C.

Figure 3:
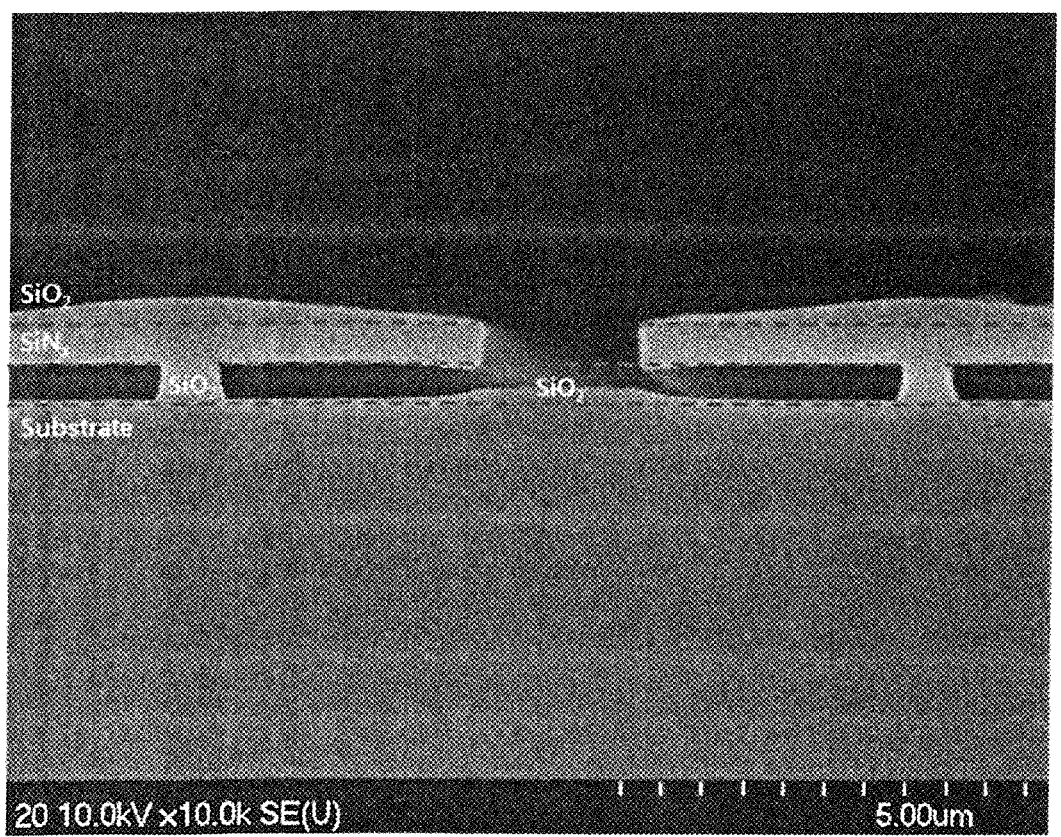
FIG. 3 is a photograph of a nitride-based semiconductor grown according to an exemplary embodiment of the present disclosure, taken by a scanning electron microscope.

A third mask layer 200c is formed in the recess 400 formed by the wet etching. The third mask layer 200c may be made of the same material as or a different material from that of the first mask layer 200a or that of the second mask layer 200b. From the photograph of FIG. 3, the recess 400 and the third mask layer 200c ($SiO_2$) formed therein can be seen.

Subsequently, a nitride-based semiconductor is grown from the exposed parts of the substrate 100 on sides of the third mask layer 200c, and is expanded via the opening 300. The nitride-based semiconductor may be grown by epitaxial lateral overgrowth in addition to the vertical growth. The growth of the nitride-based semiconductor may be performed by the halide vapour phase epitaxy (HVPE), the close space vapour phase transport (CSVT), preferably by the metal organic vapour phase epitaxy (MOVPE).

The nitride-based semiconductor grown to be expanded via the opening 300 is re-grown along with the lateral growth. Accordingly, the nitride-based semiconductor is merged with another nitride-based semiconductor re-grown from an adjacent opening, to cover the upper side of the second mask layer 200b. In this manner, a nitride-semiconductor layer 500 covering the second mask 200b may be formed.

Figure 1F:
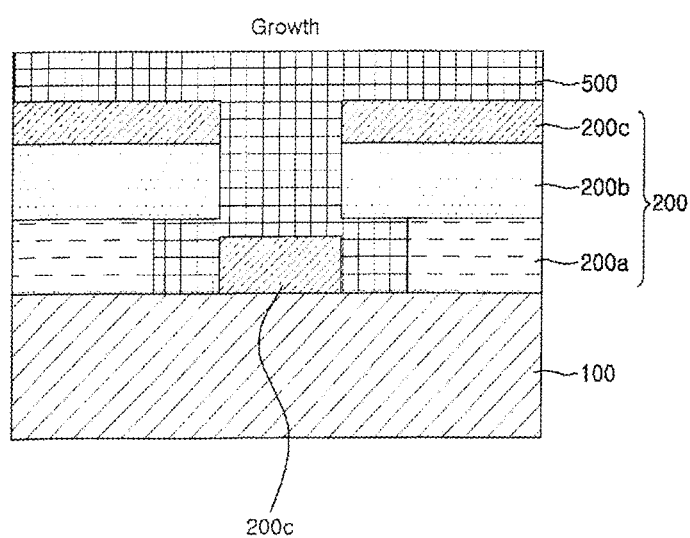
Figure 2A:
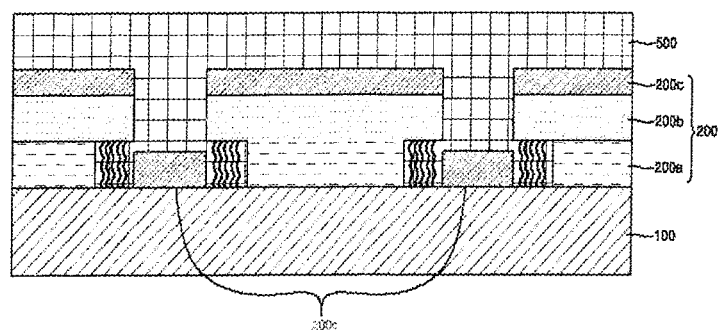
FIGS. 2a to 2d are views for illustrating processes of separating a nitride-based semiconductor with high quality from a substrate, according to an exemplary embodiment of the present disclosure.
Figure 2B:
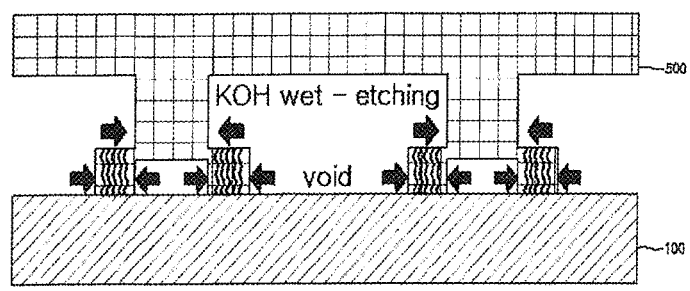
Figure 2C:
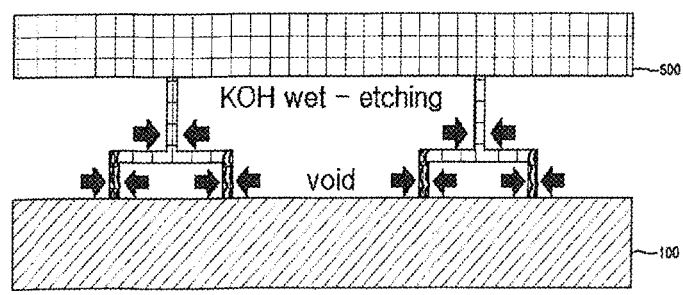
Figure 2D:
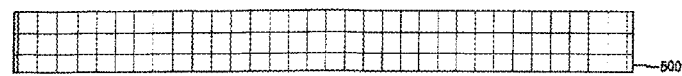
Figure 2D:
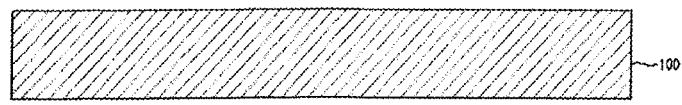

One or more mask layers may be interposed between the second masks layer 200b and the re-grown nitride-based semiconductor layer 500. For example, the third mask layer 200c may be interposed as shown in FIG. 1f. It may be the third mask layer 200c formed during the process of forming the third mask layer 200c in the recess 400.

The height and width of the mask layers (the first mask layer 200a and the second mask layer 200b) may be adjusted so that the second mask 200b is stably covered by the nitride-based semiconductor. For example, the width of the mask layers may be 1 μm to 50 μm, 1, preferably 3 μm to 10 μm. The height of the mask layers may be approximately 6 μm. However, the numerical values of the height and width are merely illustrative.

The nitride-based semiconductor layer 500 re-grown on the second mask layer 200b may be formed by the epitaxial lateral overgrowth (ELO) technique. Since the threading dislocations from the lower layer are covered by the mask layers or bent toward the sides in the growth direction, the number of crystal defects reaching the surface is drastically reduced.

Moreover, the ratio between the lateral growth rate and the vertical growth rate of the nitride-based semiconductor can be adjusted depending on the height and width of the mask layers. For example, the ratio between the vertical growth rate and the lateral growth rate of the nitride-based semiconductor may range from 1:2 to 2:1, preferably 1:2 to 1:1. However, the numerical values of the ratio are merely illustrative.

The opening 300 may work as a seed from which the nitride-based semiconductor is grown toward the upper side of the second mask layer 200b. In addition, the opening 300 may attach the nitride-based semiconductor 500 re-grown over the second mask layer 200b to the substrate 100 after the mask layer 200 has been removed as will be described below. Accordingly, the width of the opening 300 is preferably determined so that it can work as the seed for growing the nitride-based semiconductor layer 500. In addition, in order to easily separate the substrate 100 from the nitride-based semiconductor 500 after the mask layer 200 has been removed, it is preferably to make that area of contact as small as possible. Accordingly, the width of the opening 300 may range from 0.5 μm to 2 μm, preferably 1 μm. However, the numerical values of the width are merely illustrative.

Subsequently, the first mask layer 200a, the second mask layer 200b and the third mask layer 200c are removed by wet etching using a first etchant. Then, the nitride-based semiconductor grown in the opening 300 is removed using a second etchant. By doing so, the nitride-based semiconductor layer 500 re-grown on the second mask 200b can be separated from the substrate 100.

Specifically, the first mask layer 200a, the second mask layer 200b and the third mask layer 200c are removed using the first etchant to form a void. The first etchant to be used may include HCL and/or $H_2SO_4$ or may be selected from the etchants used for forming the recess 400.

Then, the second etchant may permeate between the substrate 100 and the nitride-based semiconductor layer 500 via the void and the region where the mask layers (the first mask layer 200a, the second mask layer 200b and the third mask layer 200c) have been removed as a channel. The second etchant may etch the nitride-based semiconductor grown in the opening 300 in the lateral direction from the void. The second etchant may include at least one of KOH, HF and the buffered oxide etchant (BOE) or may be selected from the etchants for forming the recess 400.

Instead of or in addition to using the second etchant, the nitride-based semiconductor layer 500 may be separated from the substrate 100 using a physical/chemical method. In addition, the width of the opening 300 may be adjusted to make the forming the nitride-based semiconductor layer 500 and the separating the substrate 100 easier.

The etchants and the processing conditions for the wet etching using the first etchant and the second etchant are equal to those described above, and thus will not described again to avoid redundancy.

As described above, the nitride-based semiconductor layer 500 re-grown on the second mask 200b exhibits good crystal property with significantly reduced crystal defects such as dislocations. Accordingly, the nitride-based semiconductor layer 500, when separated from the substrate 100 to be applied to an electronic device, is expected to improve the performance of the electronic device.

The nitride-based semiconductor grown according to the method of the exemplary embodiment of the present disclosure can be applied to an LED, P-N junction, a thin-film transistor, a single-junction solar cell, a multi-junction solar cell, a photodiode, a laser, a sensor, an electro-optical device, a CMOS device, a MOSFET device, a MESFET device, a photovoltaic cell, a MEMS device, a nanoelectromechanical device, a HEMT device, a light-emitting transistor, etc.

Hereinafter, an exemplary embodiment of the present disclosure will be described in more detail. The exemplary embodiment of the present disclosure is merely illustrative but is not limiting.

[Exemplary Embodiment]

A $SiO_2$ layer (a first mask layer) and a SiN layer (a second mask layer) were formed in this order on a GaN substrate by the MOCVD method. Subsequently, a pattern was formed on the SiN layer, and the $SiO_2$ layer and the SiN layer were etched in the vertical direction by dry reactive ion etching (RIE), to form an opening in which a part of the substrate is exposed.

Figure 4:
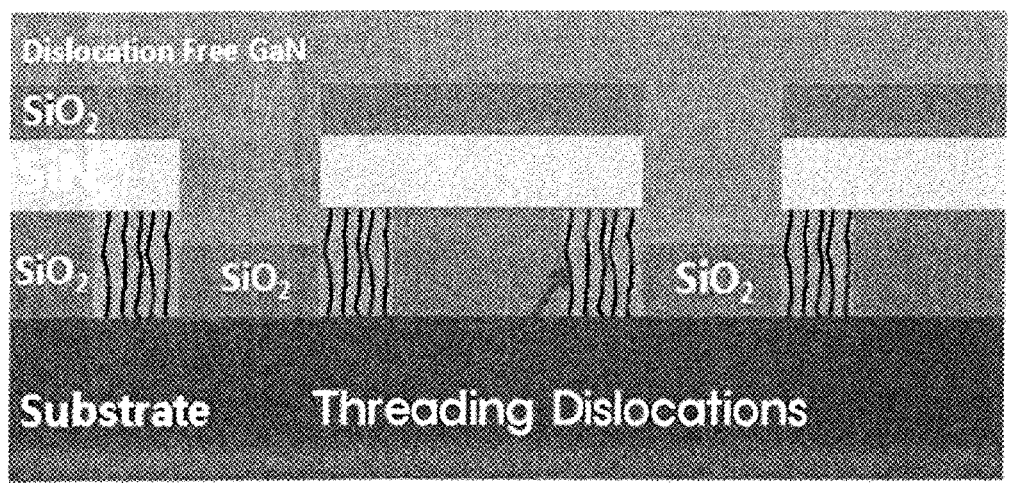
FIG. 4 is a schematic view of a T-shaped mask layer and a re-grown GaN layer formed according to an exemplary embodiment of the present disclosure.
Figure 5A:
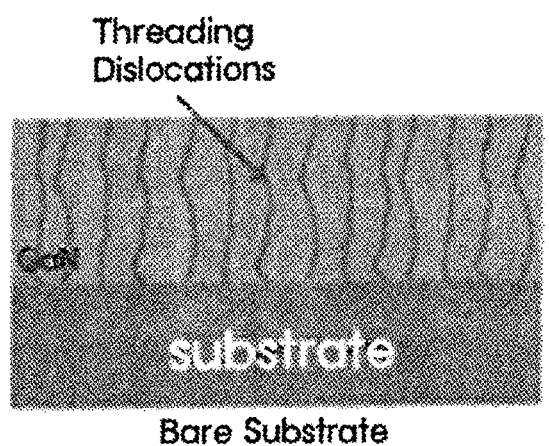
FIGS. 5a to 5c are views for illustrating problems in the existing methods for growing a nitride-based semiconductor (GaN).
Figure 5B:
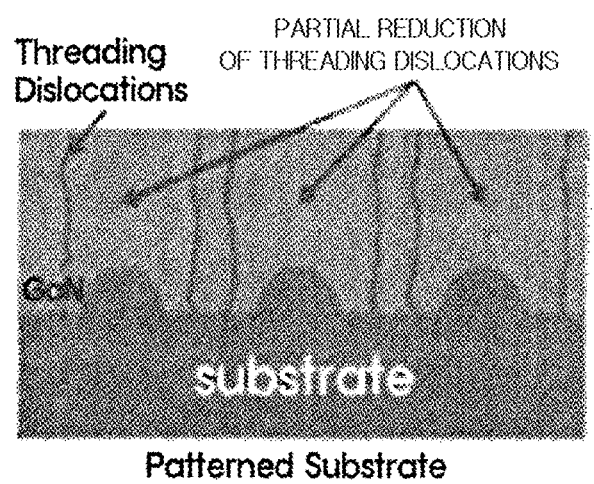
Figure 5C:
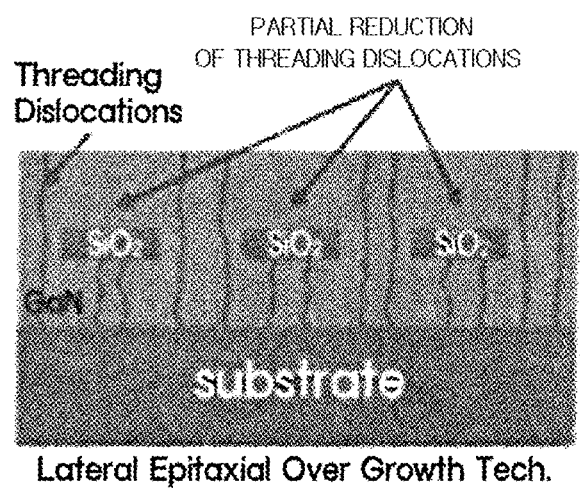

Subsequently, the $SiO_2$ layer (the first mask layer) was selectively etched in the opening by the BOE wet etching, to form recess. Subsequently, the $SiO_2$ layer (a third mask layer) was formed in the recess by the MOCVD method. GaN was grown from the exposed part of the substrate on the sides of the $SiO_2$ layer formed in the recess to be expanded via the opening. Then, it was re-grown to the upper side of the SiN layer to be merged with another GaN re-grown from an adjacent opening. FIG. 4 shows a T-shaped mask layer and the re-grown GaN layer formed in this manner. The GaN grown in the recess is expected to have large threading dislocations. However, the GaN re-grown on the upper side of the SiN layer is expected to have almost no dislocation as the SiN layer (the second mask layer) and the $SiO_2$ layer (the third mask layer) block the threading dislocation transferred from the lower portion.

Subsequently, to obtain GaN with almost no dislocation, the first mask, the second mask and the third mask were removed by KOH wet etching, and then the GaN formed in the opening was additionally removed to separate GaN from the substrate.

The separated GaN has exhibited the dislocation density below $10^6$ $cm^{-2}$, which is significantly lower than the dislocation density of the GaN grown according to the existing method, i.e., $10^8$ $cm^{-2}$ to $10^{10}$ $cm^{-2}$.

The invention claimed is:

1. A method for growing a nitride-based semiconductor with high quality, the method comprising:
   forming a first mask layer on a substrate and forming a second mask layer on the first mask layer;
   performing dry etching on the first mask layer and the second mask layer which forms multiple openings in the first mask layer and the second mask layer and in which a part of the substrate is exposed;
   performing selective wet etching on the first mask layer abutting the multiple openings to form multiple recesses in the first mask layer and in which a second part of the substrate is exposed;
   depositing a third mask layer in the multiple recesses; and
   growing a nitride-based semiconductor from exposed surfaces of the substrate on sides of the third mask layer and expanding the growth of the nitride-based semiconductor via the multiple openings.

2. The method of claim 1, further comprising:
   performing wet etching on the first mask layer, the second mask layer and the third mask layer which forms a void after the nitride-based semiconductor expanded via the multiple openings is grown and merged with another nitride-based semiconductor grown from an adjacent opening to cover a upper side of the second mask layer; and
   removing the nitride-based semiconductor grown via the multiple openings from the void.

3. The method of claim 1, further comprising:
   forming a pattern on the second mask layer before performing the dry etching.

4. The method of claim 1, wherein each of the first mask layer, the second mask layer and the third mask layer comprises one of $SiO_2$, SiN, $Si_3N_4$, ZnS, $Ta_2O_5$, $TiO_2$, $ZrO_2$, $Y_2O_3$, STO ($SrTiO_3$), BST (($Ba,Sr)TiO_3$)) and silicon oxynitride (SiON).

5. The method of claim 1, wherein a wet etching rate of the first mask layer is larger than a wet etching rate of the second mask layer.

6. The method of claim 1, wherein the third mask layer is made of the same material as or a different material from a material of the first mask layer or a material of the second mask layer.

7. The method of claim 1, wherein performing the selective wet etching comprises:
   performing the selective wet etching at a temperature between a room temperature and 350° C. using one of: hydrofluoric acid (HF), hydrochloric acid (HCl), nitric acid ($HNO_3$), sulfuric acid ($H_2SO_4$), phosphoric acid ($H_3PO_4$), oxalic acid, buffered oxide etchant (BOE), sodium hydroxide (NaOH), potassium hydroxide (KOH), hydrogen peroxide ($H_2O_2$), acetone, tetramethyl ammonium hydroxide (TMAH), ethylenediamine, pyrocatechol, hydrazine chelating amines, 1,2-diaminoethane, N,N-dimethylacetamide and water, or a mixed solution prepared as a combination thereof.

8. The method of claim 1, wherein performing the dry etching comprises using at least one gas selected from the group consisting of $Cl_2$, HBr, HCl, $SF_6$, $CF_4$, $CHF_3$, $NF_3$, $O_2$ and chlorofluorocarbons (CFCs).

9. The method of claim 1, wherein performing the dry etching further comprises using at least one of $N_2$, Ar and He inert gases.

10. The method of claim 1, wherein the substrate is made of a material selected from the group consisting of sapphire, Si, glass, quartz, GaN, GaAs, SiC, ZnO and MgO.

11. The method of claim 1, wherein the nitride-based semiconductor is expressed in the following formula: $Al_xGa_yIn_{1-x-y}N$ ($0 \leq x \leq 1, 0 \leq y \leq 1, 0 \leq x+y \leq 1$).

* * * * *